(12) United States Patent
Yamamoto

(10) Patent No.: US 7,118,645 B2
(45) Date of Patent: Oct. 10, 2006

(54) METHOD AND APPARATUS FOR JOINING PROTECTIVE TAPE TO SEMICONDUCTOR WAFER

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/939,453

(22) Filed: Sep. 14, 2004

(65) Prior Publication Data

US 2005/0072517 A1    Apr. 7, 2005

(30) Foreign Application Priority Data

Oct. 7, 2003    (JP)    ............................ 2003-347750

(51) Int. Cl.
*B26D 1/00*    (2006.01)
*H01L 21/68*    (2006.01)

(52) U.S. Cl. ........................ 156/270; 156/522; 156/523
(58) Field of Classification Search ................ 156/247, 156/256, 517, 522, 523, 540, 556, 270
See application file for complete search history.

(56) References Cited

FOREIGN PATENT DOCUMENTS

| JP | 60-231328 | * | 11/1985 |
| JP | 62-174940 | * | 7/1987 |
| JP | 10-112492 | * | 4/1998 |
| JP | 2003-209082 A1 | | 7/2003 |

* cited by examiner

*Primary Examiner*—Linda Gray
(74) *Attorney, Agent, or Firm*—Rader, Fishman & Grauer PLLC

(57) ABSTRACT

A method for joining a protective tape to a semiconductor wafer includes the steps of: mounting a semiconductor wafer, which has a surface with a pattern formed thereon, on a holding member; joining a protective tape, which protects the pattern, to the surface of the semiconductor wafer and, also, to a surface of an outer peripheral member disposed around the holding member; and cutting out the protective tape along an outer circumference of the semiconductor wafer. The holding member and the outer peripheral member are disposed on a holding table, which holds the semiconductor wafer, so as to be adjacent to each other, and the outer peripheral member is formed from a member which is different from that of the holding table.

4 Claims, 4 Drawing Sheets

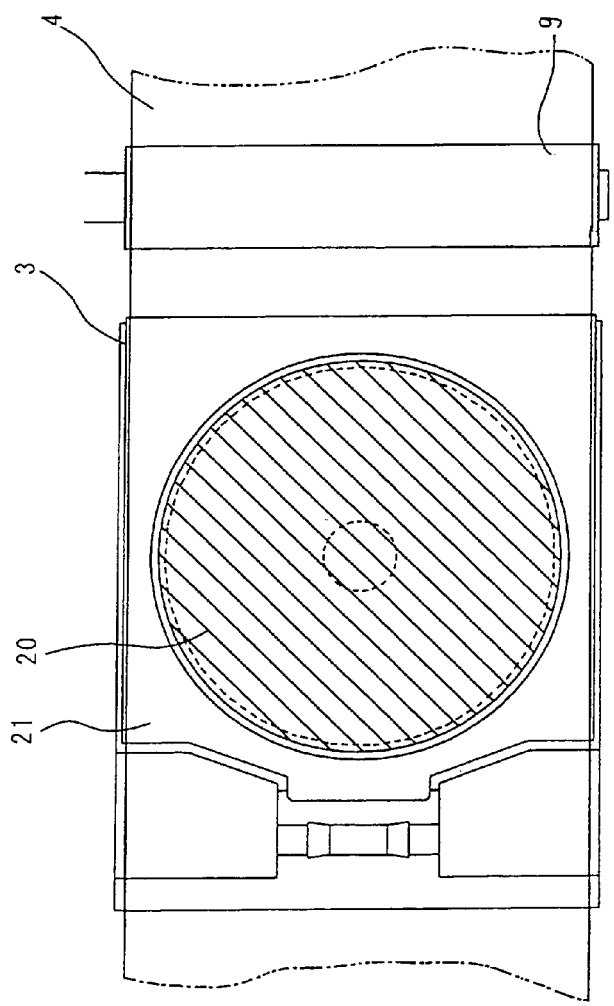
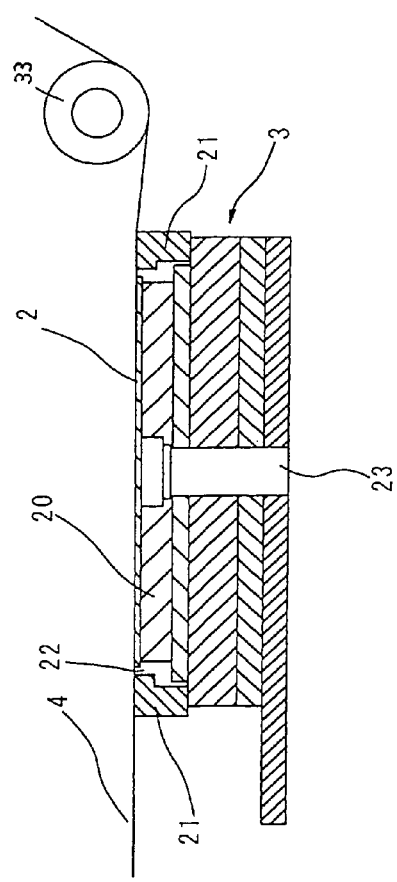
Fig.2A
Fig.2B

METHOD AND APPARATUS FOR JOINING PROTECTIVE TAPE TO SEMICONDUCTOR WAFER

BACKGROUND OF THE INVENTION (1) Field of the Invention

The present invention relates to a method and an apparatus for joining a protective tape to a surface, on which a pattern is formed, of a semiconductor wafer.

(2) Description of the Related Art

Examples of a thin film working method of a semiconductor wafer (hereinafter, also simply referred to as "wafer") include a mechanical method and a chemical method such as a grinding method, a polishing method (CMP) and an etching method. In these methods, after a protective tape is joined to a surface, on which a wiring pattern is formed, of a wafer, a back grind method for grinding a back surface of the wafer is generally used.

In the back grind method, a surface (pattern surface) of a wafer is suction-held by a holding table, and a back surface of the wafer is ground using a grindstone. Herein, stress is applied to the surface of the wafer due to the grinding operation, and the pattern may be damaged or contaminated in some cases. For this reason, a protective tape is joined to the surface of the wafer.

Generally, a band-like tape is used as the protective tape, an joining roller is allowed to roll on the wafer, and the protective tape is sequentially joined to the surface of the wafer from an end of the wafer. Conventionally, a diameter of the protective tape to be joined to the surface of the wafer is smaller than a diameter of the semiconductor wafer. This is because that if the protective tape is larger than the semiconductor wafer in diameter, when the wafer is subjected to the back grind processing, a portion of the protective tape which comes out or protrudes from the wafer may flap and damage a circumferential end (edge) of the wafer. The protective tape joined to the surface of the wafer in this manner is separated during a separating process after the back grind processing.

However, a semiconductor wafer to which the protective tape is joined and which is subjected to the back grind processing has following problems. That is, a wafer which has been thinned by the back grind processing has an acute edge which projects from the protective tape covering the wafer. Therefore, if the wafer is contained in a cassette, the edge sticks into an inner wall of the cassette. There is a problem that if the wafer is to be taken out from the cassette from such a state, the edge of the wafer is damaged, or a taking-out error is occurred.

The present inventor apply himself closely to the study thereof and, as a result, he performed an experiment in which a protective tape having a diameter larger than that of a wafer is joined to a surface of the wafer and the back grind processing was carried out. As a result, the present inventors found that even when the protective tape protruded from the wafer, the edge or the like of the wafer was not damaged, and patent applications were filed (see JP-A 2003-209082 for example).

According to the above method, the edge or the like of the wafer were not damaged, but since the protective tape having a diameter larger than that of the wafer is used, after the protective tape is cut, an unnecessary portion of the protective tape remaining on an outer circumference of the wafer finely moves vertically when the protective tape is cut. Therefore, there is a new problem that a section of the protective tape joined to the surface of the wafer and a section of the unnecessary protective tape after the protective tape is cut rub against each other and particles are generated. If the wafer is subjected to the back grind processing in a state where the particles are generated on the protective tape surface, a thickness of a portion of the wafer to which the particles are generated is increased, and only this portion is ground thin. As a result, a thickness of a wafer becomes nonuniform and the wafer is damaged.

SUMMARY OF THE INVENTION

The present invention is made in view of the above circumstances, and it is an object of the present invention to provide a method and an apparatus for joining a protective tape to a semiconductor wafer, capable of reducing generation of particles upon cutting of the protective tape joined to a surface of the semiconductor wafer.

In order to achieve the above object, the present invention employs the following configuration:

A method for joining a protective tape to a semiconductor wafer, comprising the steps of:

mounting a semiconductor wafer, which has a surface with a pattern formed thereon, on a holding member;

joining a protective tape, which protects the pattern, to the surface of the semiconductor wafer and, also, to a surface of an outer peripheral member disposed around the holding member; and cutting out the protective tape along an outer circumference of the semiconductor wafer, wherein the holding member and the outer peripheral member are disposed on a holding table, which holds the semiconductor wafer, so as to be adjacent to each other, and the outer peripheral member is formed from a member which is different from that of the holding table.

In the method according to the present invention preferably, the surface of the semiconductor wafer is substantially same as the surface of the outer peripheral member in height when the semiconductor wafer is mounted and held on the holding member.

According to the method of the present invention, since the outer peripheral member is formed from a member which is different from that of the holding table, the height of the semiconductor wafer can be made substantially same as that of the outer peripheral member by changing the size of the outer peripheral member in accordance with the size of the semiconductor wafer. Moreover, a suitable gap can be formed between the outer circumference of the semiconductor wafer and the inner circumference of the outer peripheral member by appropriately selecting the outer peripheral member in accordance with the diameter of the semiconductor wafer. Further, since the outer peripheral member is formed from a member which is different from that of the holding table, even when the holding member is heated, it is possible to suppress the temperature rise of the outer peripheral member. Since it is possible to select the outer peripheral member in accordance with a material of the protective tape, an unnecessary portion of the protective tape can be easily separated from the outer peripheral member.

In the method according to the present invention, preferably, the outer peripheral member and the holding member are disposed so as to be adjacent to each other with a gap of 1 to 10 mm provided therebetween.

According to the method of the present invention, by disposing the outer peripheral member and the holding member with a gap of 1 to 10 mm, preferably 3 to 8 mm provided therebetween, the unnecessary portion of the protective tape which is joined to the outer peripheral member and protrudes therefrom does not vertically move when the protective tape is to be cut out, and generation of particles can be suppressed.

In the method according to the present invention, preferably, the holding member is heated and, also, the outer peripheral member is cooled.

According to the method of the present invention, it is possible to suppress the temperature rise of the outer peripheral member. In addition, it is possible to cool the outer peripheral member. With this configuration, only the protective tape to be joined to the wafer can be heated indirectly, and the joining temperature upon joining of the protective tape can be appropriately adjusted in accordance with a material of the protective tape. As a result, when the protective tape is joined to the surface of the wafer, the protective tape can be reliably joined to the surface of the wafer while preventing bubbles and the like from being generated between an adhesive layer and the wafer surface.

In order to achieve the above object, the present invention also employs the following configuration:

An apparatus for joining a protective tape to a surface, on which a pattern is formed, of a semiconductor wafer, comprising:

a holding member for holding the semiconductor wafer;

an outer peripheral member disposed so as to be adjacent to the holding member;

a protective tape joining mechanism for joining the protective tape to the surface of the semiconductor wafer;

a protective tape cutting mechanism for cutting out the protective tape along an outer circumference of the semiconductor wafer; and a separating mechanism for separating an unnecessary portion of the protective tape from the semiconductor wafer, wherein the holding member and the outer peripheral member are disposed on a holding table which holds the semiconductor wafer, and the outer peripheral member is formed from a member which is different from that of the holding table.

According to the apparatus of the present invention, since the outer peripheral member is formed from a member which is different from that of the holding table, the height of the semiconductor wafer can be made substantially same as that of the outer peripheral member by changing the size of the outer peripheral member in accordance with the size of the semiconductor wafer. Moreover, a suitable gap can be formed between the outer circumference of the semiconductor wafer and the inner circumference of the outer peripheral member by appropriately selecting the outer peripheral member in accordance with the diameter (size) of the semiconductor wafer. Therefore, upon cutting of the protective tape, it is possible to prevent particles from being generated from the unnecessary portion of the protective tape joined to the outer peripheral member.

In the apparatus according to the present invention, preferably, the outer peripheral member is formed from at least one or more members.

According to this configuration, since the outer peripheral member is formed from at least one or more members, it is possible to easily adjust the size of the outer peripheral member in accordance with the size of the semiconductor wafer. Even in the case where the holding member is heated, it is possible to suppress the temperature rise of the outer peripheral member. Additionally, since it is possible to select the outer peripheral member in accordance with a material of the protective tape, the unnecessary portion of the protective tape can be easily separated from the outer peripheral member.

In the apparatus according to the present invention, preferably, the holding member and the outer peripheral member are disposed so as to be adjacent to each other with a gap of 1 to 10 mm provided therebetween.

According to this configuration, one apparatus can carry out a series of processes of: joining a protective tape to a wafer; cutting out the protective tape; and separating an unnecessary portion of the protective tape from the wafer. Upon cutting of the protective tape, it is possible to prevent particles from being generated from the unnecessary portion of the protective tape joined to the outer peripheral member.

In the apparatus according to the present invention, preferably, the holding member is configured to suction-hold the semiconductor wafer. Preferably, the holding member is formed from a porous member.

According to this configuration, since the semiconductor wafer mounted on the holding means is suction-held, a warp of the wafer can be corrected and formed flat. Therefore, the protective tape can be more uniformly and efficiently joined to the semiconductor wafer.

Preferably, the apparatus according to the present invention further comprises: heating means for heating the semiconductor wafer held on the holding member; and cooling member for cooling the outer peripheral member.

According to this configuration, only the protective tape joined to the wafer held by the holding member can be indirectly heated. Therefore, the joining temperature upon joining of the protective tape can be appropriately adjusted in accordance with a material of the protective tape. Thus, when the protective tape is joined to the surface of the wafer, the protective tape can be reliably joined to the surface of the wafer while preventing bubbles and the like from being generated between an adhesive layer and the wafer surface.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2A is a plan view showing one example of a holding table used in the protective tape joining apparatus according to the embodiment of the present invention;

FIG. 2B is a schematic front sectional view of one example of the holding table used in the protective tape joining apparatus according to the embodiment of the present invention;

DESCRIPTION OF THE PREFERRED EMBODIMENTS

Hereinafter, description will be given of one example of embodiments according to the present invention with reference to the drawings.

It is noted herein that a protective tape joining method and a protective tape joining apparatus according to the present invention are not limited to the following embodiments.

Figure 1:
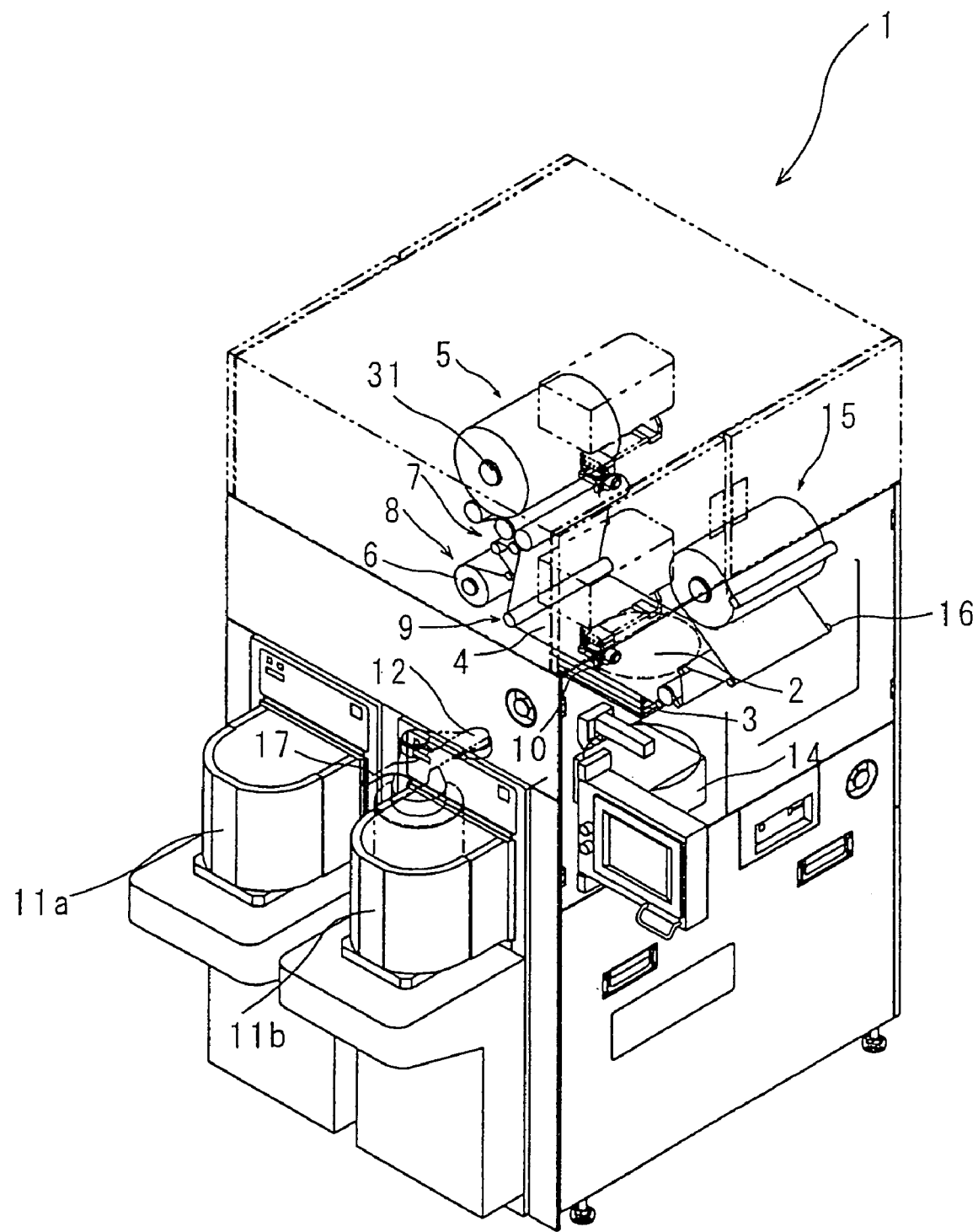
FIG. 1 is an overall schematic view showing one example of a protective tape joining apparatus according to an embodiment of the present invention.

As shown in FIG. 1, a protective tape joining apparatus 1 according to this embodiment mainly comprises wafer containers 11a, 11b for containing therein wafers 2 each of which is an article to which a protective tape is joined, a robot arm 12 as transport means for transporting the wafer 2 from each of the wafer containers 11a, 11b, an alignment stage 14 for mounting thereon the wafer 2 transported by the robot arm 12 to position the wafer 2, a holding table 3 as an article holder for holding the positioned wafer 2, a tape supply unit 5 for supplying a protective tape 4 onto the wafer 2 mounted on the holding table 3, a releasing mechanism 7 for releasing the protective tape 4 from a release liner 6, a liner winding unit 8 for winding up the release liner 6 released by the releasing mechanism 7, a joining mechanism 9 for joining the protective tape 4 supplied from the tape supply unit 5 to the wafer 2, protective tape cutting means 10 for cutting out the protective tape 4 joined to the wafer 2 along an outer circumference of the wafer 2, and an unnecessary tape winding unit 15 for winding up an unnecessary portion of the protective tape 4.

The wafer containers 11a, 11b can contain therein and mount thereon the plural wafers 2 in multiple stages. Herein, each of the wafers 2 is in a horizontal posture in which its pattern surface is directed upward.

The robot arm 12 is turned by a driving mechanism (not shown). The robot arm 12 is provided at its tip end with a horseshoe-shaped wafer holder 17. The wafer holder 17 is provided with a suction hole (not shown), so that the wafer 2 is vacuum-sucked from the back surface.

That is, the wafer holder 17 of the robot arm 12 moves rearward a gap between the wafers 2 contained in the wafer containers 11a, 11b in the multiple stages and suction-holds the wafer 2 from its back surface. The suction-held wafer 2 is transported to the alignment stage 14 which is positioning means, the holding table 3 and the wafer containers 11a, 11b in this order.

The alignment stage 14 positions the mounted wafer 2 on the basis of an orientation flat or the like.

As shown in FIGS. 2A and 2B, the holding table 3 includes a holding member 20 on which the wafer 2 is mounted and held, and an outer peripheral member 21 which is disposed in the vicinity of an outer circumference of the holding member 20 such as to form a protective tape cutting groove 22 into which a cutter blade 35 of the protective tape cutting means 10 for cutting out the protective tape 4 is inserted. The holding member 20 and the outer peripheral member 21 are disposed such that, when the wafer 2 is mounted on the holding member 20, a surface of the wafer 2 and a surface of the outer peripheral member 21 are substantially flush with each other. The protective tape 4 is simultaneously joined to the surface of the wafer 2 and the surface of the outer peripheral member 21 by a series of processes of the protective tape joining mechanism 9. The holding member 20 and the outer peripheral member 21 are disposed on the holding table 3, respectively, and the outer peripheral member 21 is formed from a member which is different from that of the holding table 3. That is, the outer peripheral member 21 and the holding table 3 are not integrally formed together, and they can separate from each other. Although it is preferable that the outer peripheral member 21 and the surface of the wafer 2 are substantially flush with each other in height, the present invention is not limited to this design. The outer peripheral member 21 may be formed from a plurality of divided members.

Since the outer peripheral member 21 and the holding table 3 are formed from different members, a size of the outer peripheral member 21 can be changed in accordance with a size of the wafer 2. With this configuration, if the outer peripheral member 21 can appropriately be selected in accordance with a thickness of the wafer 2, the outer peripheral member 21 and the surface of the wafer 2 can substantially be flush with each other in height. If the outer peripheral member 21 is appropriately selected in accordance with a diameter of the wafer 2, it is possible to form a gap as the protective tape cutting groove 22 between an outer circumference of the wafer 2 and an inner circumference of the outer peripheral member 21. Further, since the outer peripheral member 21 and the holding table 3 are the different members from each other, even when the holding member 20 is heated, it is possible to suppress the temperature rise of the outer peripheral member 21. In addition, cooling means can be provided in the outer peripheral member 21. With this configuration, it is possible to appropriately adjust the joining temperature upon joining of the protective tape in accordance with a material of the protective tape, and the protective tape 4 can be reliably joined to the surface of the wafer 2 while preventing the generation of bubbles and the like. Since the outer peripheral member 21 can be appropriately selected, a suitable outer peripheral member can be selected from outer peripheral members having different surface roughnesses in accordance with a kind of the protective tape, and an unnecessary portion of the protective tape 4, which has been cut out, can be easily separated from the outer peripheral member 21.

The holding member 20 is formed at its center with a passage 23 for a suction pad (not shown) which is in communication with an evacuating apparatus (not shown) and which is disposed in a vertically movable manner. The holding member 20 is formed with a suction groove which is in communication with the evacuating apparatus (not shown) so that the wafer 2 can be suction-held. The holding member 20 may be formed from a porous member. If the porous member is used as the holding member 20, the wafer 2 can be suction-held even when the holding member 20 is not formed with the suction groove.

The protective tape cutting groove 22 is formed between the holding member 20 and the outer peripheral member 21 disposed in the vicinity of the holding member 20. It is preferable that a width of the protective tape cutting groove 22 is 1 to 10 mm, preferably 3 to 8 mm, more preferably 3 to 5 mm. With this configuration, upon cutting of the protective tape, an unnecessary protruding portion of the protective tape joined to the outer peripheral member 21 does not move vertically, and it is possible to prevent generation of particles.

Figure 4:
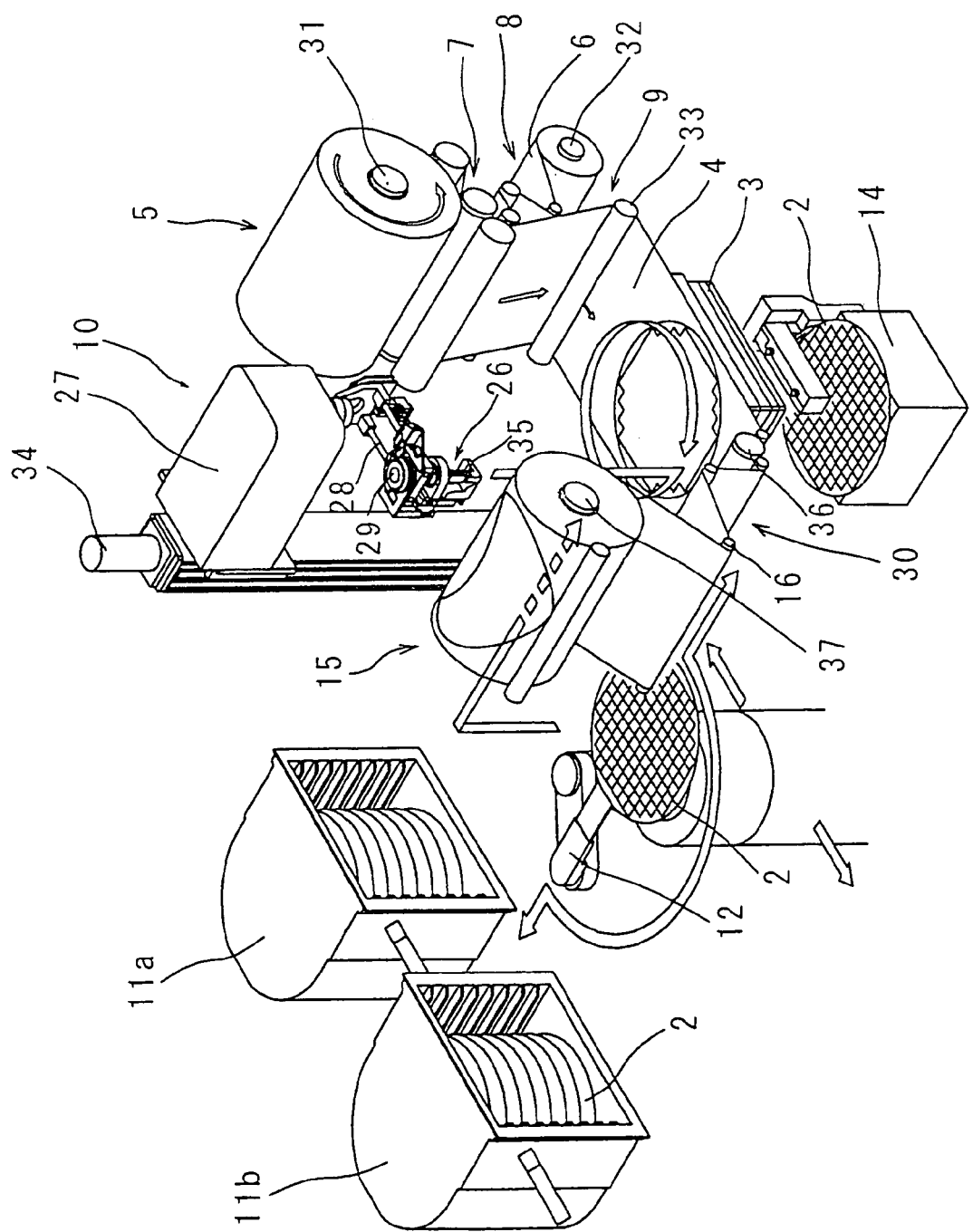
FIG. 4 is an enlarged schematic view of a main part of one example of the protective tape joining apparatus according to the embodiment of the present invention.

As shown in FIG. 4, the tape supply unit 5 winds and guides the protective tape 4 with the release liner 6 unreeled from a tape bobbin 31 around and into the releasing mechanism 7 including guide rollers. Rotation of the tape supply unit 5 is limited through a brake mechanism which is pivotally supported by a vertical wall of an apparatus body.

The release liner winding unit 8 includes a collecting bobbin 32 which is interlockingly connected to a driving mechanism such as a motor, and guide rollers which are pivotally supported by the vertical wall of the apparatus body.

The tape joining mechanism 9 has a frame (not shown) which is grasped by rails of the apparatus body such that the frame can slide in a running direction of the tape, and the tape joining mechanism 9 is interlockingly connected to a driving unit such as a motor. An joining roller 33 is rotatably and pivotally supported by the frame. The joining roller 33 vertically swings by a cylinder (not shown) or the like. That is, the joining roller 33 presses the surface of the protective tape 4 and rolls and, in this state, the joining roller 33 joins the protective tape 4 to the surface of the wafer 2.

The protective tape cutting means 10 includes a cutter unit 26 which is attached to a ball shaft 34 in a vertically movable manner, a vertical driver 27 which vertically moves the cutter unit 26, and a controller (not shown) which controls the vertical driver 27.

The cutter unit 26 includes an arm 28 which is supported by the vertical driver 27 in a cantilever manner, a motor 29 attached to an upper portion of a tip end of the arm 28, and a cutter blade 35. One end of the cutter blade 35 is connected to a rotation shaft of the motor 29 which penetrates the arm 28 downward. The cutter blade 35 faces down so that it can turn.

The vertical driver 27 moves vertically along the ball shaft 34. The ball shaft 34 is provided at its bottom with a stopper (not shown) which limits the lowermost position (height) of the vertical driver 27.

The motor 29 transmits rotation force to the cutter blade 35 through the rotation shaft, thereby turning the cutter blade 35.

An unnecessary tape separating mechanism 30 has a frame (not shown) which is grasped by the rails of the apparatus body such that the frame can slide in the running direction of the tape, and the unnecessary tape separating mechanism 30 is interlockingly connected to a driving unit such as a motor. A separating roller 36 is rotatably and pivotally supported by the frame, and the separating roller 36 vertically swings by a cylinder (not shown). The separating roller 36 is used for separating, from the wafer 2, the unnecessary portion of the protective tape 4 which has been cut out along the outer circumferential edge of the wafer 2.

A collecting bobbin 37 of the unnecessary tape winding unit 15 is pivotally supported by the vertical wall of the apparatus 1, and is interlockingly connected to a driving unit such as a motor. That is, a predetermined amount of protective tape 4 is unreeled from the tape supply unit 5 and is supplied onto the wafer 2, and if the driving unit is operated, the unnecessary portion of the protective tape 4, which has been cut out, is wound around the collecting bobbin 37.

Next, description will be given of a series of operations upon cutting of the protective tape 4 with reference to the drawings. One of wafers 2 superposed on one another with a gap provided therebetween and contained in the container 11*a* or 11*b* is taken out by the robot arm 12. Herein, the wafer holder 17 of the robot arm 12 is inserted into a space between the wafers 2 in the wafer container 11*a* or 11*b*. The robot arm 12 suction-holds the wafer 2 from its back surface using the wafer holder 17 and takes the wafer 2 out, and transports the wafer 2 to the alignment stage 14.

The wafer 2 mounted on the alignment stage 14 is positioned on the basis of the orientation flat or a notch. After the wafer 2 is positioned, the back surface of the wafer 2 is suction-held by the robot arm 12, and the wafer 2 is transported onto the holding table 3.

The wafer 2 mounted on the holding member 20 on the holding table 3 is positioned and, then, is suction-held. Herein, the joining mechanism 9 of the protective tape 4 and the tape separating mechanism 30 are located at initial positions, and the cutter unit 26 is located at a standby position above the initial positions.

If the positioning of the wafer 2 is completed, the joining roller 33 of the joining mechanism 9 of the protective tape 4 downwardly swings, the joining roller 33 presses the protective tape 4 and, in this state, the joining roller 33 rolls on the wafer 2 and the outer peripheral member 21 in a direction opposite from the tape running direction, the protective tape 4 is joined to the entire surface uniformly, and the protective tape 4 is also joined to the surface of the outer peripheral member 21. If the joining mechanism 9 of the protective tape 4 reaches the end position, the joining roller 33 moves upward.

Figure 3:
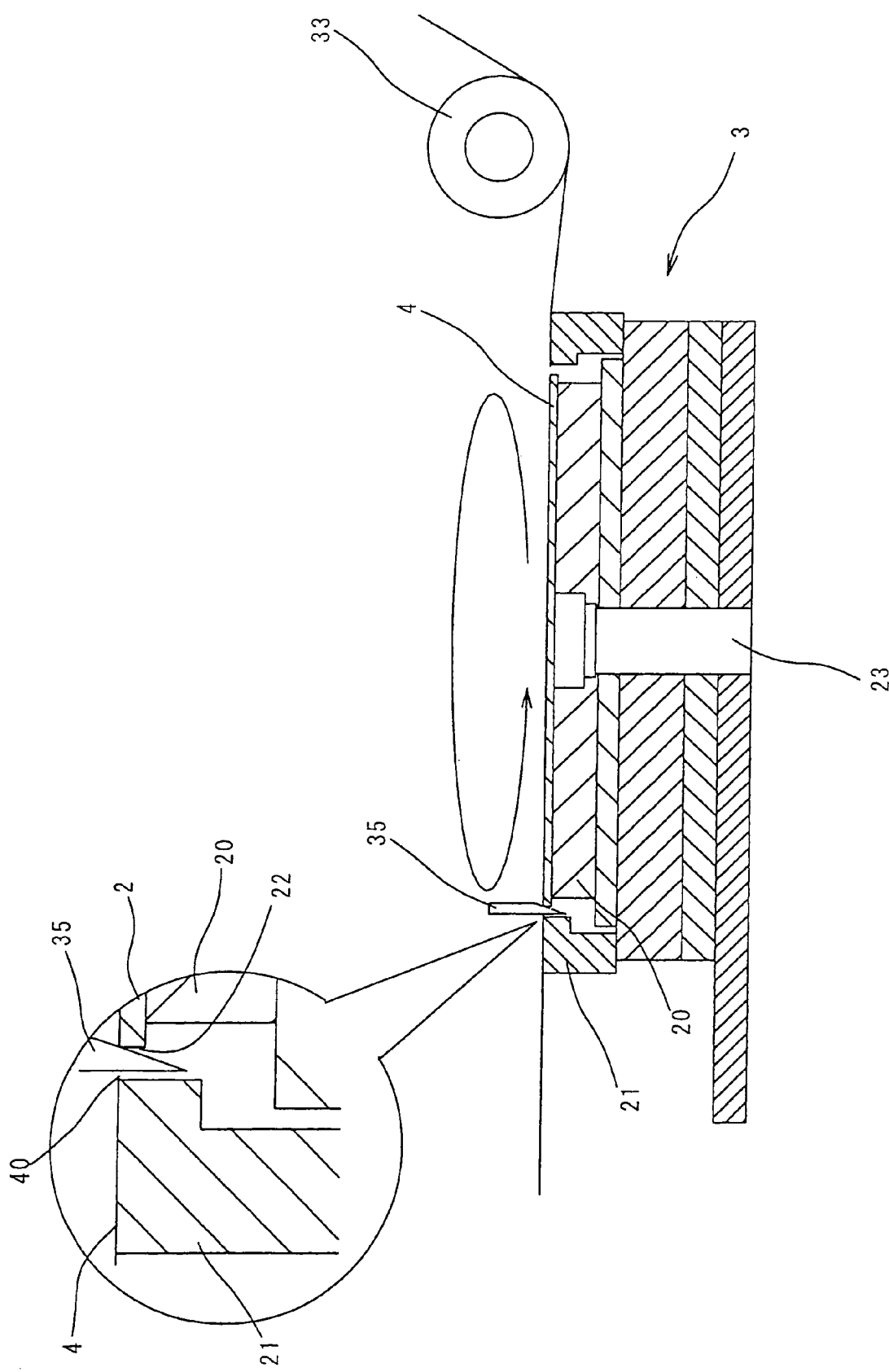
FIG. 3 is an explanatory view of one example of a protective tape joining method according to an embodiment of the present invention.

Next, as shown in FIG. 3, the cutter unit 26 downwardly moves to a protective tape cutting position, and the cutter blade 35 sticks into and penetrates the protective tape cutting groove 22 of the protective tape 4. Herein, the cutter blade 35 which has penetrated the protective tape 4 is stopped at a predetermined position (height). The cutter blade 35 which has stopped at the predetermined position moves along the outer circumference of the wafer 2. That is, the cutter blade 35 cuts the protective tape 4 along the outer circumferential edge of the wafer 2. Herein, since the width of the protective tape cutting groove 22 is 1 to 10 mm, preferably 3 to 8 mm, more preferably 3 to 5 mm, the protruding amount of the end of the protective tape 4 closer to the outer peripheral member 21 from the outer peripheral member 21 toward the protective tape cutting groove 22 can be suppressed, and it is possible to prevent the unnecessary tape closer to the wafer 2 from rubbing against each other upon cutting of the protective tape 4. Therefore, generation of particles caused when the unnecessary tape rubs can be prevented.

After the protective tape 4 is cut, the cutter unit 26 moves upward and returns to its standby position.

Next, the unnecessary tape separating mechanism 30 moves on the wafer 2 in a direction opposite from the tape running direction and, in this state, the unnecessary tape separating mechanism 30 winds up and separates the unnecessary protective tape 4 which has been cut out on the wafer 2.

If the unnecessary tape separating mechanism 30 reaches the end position of the separating operation, the unnecessary tape separating mechanism 30 and the joining mechanism 9 move in the tape running direction, and return to their initial positions. Herein, the unnecessary portion of the protective tape 4 is wound around the collecting bobbin 37 by the winding roller 16. At the same time, the protective tape 4 is unreeled from the tape supply unit 5 together with a given amount of release liner 6 and, when the protective tape 4 passes through the releasing mechanism 7, the release liner 6 and the protective tape 4 are released from each other. With the above operation, the series of operations of joining the protective tape 4 to the surface of the wafer 2 is completed.

As described above, according to the present invention, the protective tape is joined to the wafer and the outer peripheral member disposed around the wafer and, then, the protective tape is cut. Therefore, the section of the unnecessary protective tape and the section of the protective tape joined to the wafer do not rub against each other, and the frequency of generation of particles caused by friction can be reduced.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for applying a protective tape to a semiconductor wafer, comprising the steps of:

putting an outer peripheral member formed from members different from a holding table on a plane same as a holding table putting holding means so as to be arranged near a periphery of the holding means;

forming a minute gap by arranging an outer periphery of the wafer near an inner side of the outer peripheral member when a wafer is put on holding means located in an inner opening formed by the outer peripheral member;

setting a surface height of the outer peripheral member same as a plane height similar to a surface height of the wafer put on the holding member;

affixing a protective tape over an outer peripheral member and a face on which a pattern of the wafer is formed; and cutting the protective tape along an outer periphery of the wafer at a part covering the minute gap formed by an outer periphery of the wafer and the outer peripheral member.

2. The method to claim 1, wherein the outer peripheral member and the holding member are disposed so as to be adjacent to each other with a gap of 1 to 10 mm provided therebetween.

3. A method according for joining a protective tape to a semiconductor wafer, comprising the steps of:

mounting a semiconductor wafer, which has a surface with a pattern formed thereon, on a holding member;

joining a protective tape, which protects the pattern, to the surface of the semiconductor wafer and, also, to a surface of an outer peripheral member disposed around the holding member; and cutting out the protective tape along an outer circumference of the semiconductor wafer, wherein the holding member and the outer peripheral member are disposed on a holding table, which holds the semiconductor wafer, so as to be adjacent to each other, and the outer peripheral member is formed from a member which is different from that of the holding table, wherein the holding member is heated and, also, the outer peripheral member is cooled.

4. An apparatus for joining a protective tape to a surface, on which a pattern is formed, of a semiconductor wafer, comprising:

a holding member for holding the semiconductor wafer;

an outer peripheral member disposed so as to be adjacent to the holding member;

a protective tape joining mechanism for joining the protective tape to the surface of the semiconductor wafer;

a protective tape cutting mechanism for cutting out the protective tape along an outer circumference of the semiconductor wafer; and a separating mechanism for separating an unnecessary portion of the protective tape from the semiconductor wafer, wherein the holding member and the outer peripheral member are disposed on a holding table which holds the semiconductor wafer, the outer peripheral member is formed from a member which is different from that of the holding table, heating means for heating the semiconductor wafer held on the holding member; and cooling member for cooling the outer peripheral member.

* * * * *